United States Patent [19]
Rundel

[11] Patent Number: 5,914,681
[45] Date of Patent: Jun. 22, 1999

[54] FAST WAKEUP BIASING CIRCUIT FOR ANALOG-TO-DIGITAL CONVERTER

[75] Inventor: Bernd M. Rundel, Tucson, Ariz.

[73] Assignee: Burr-Brown Corporation, Tucson, Ariz.

[21] Appl. No.: 08/942,800

[22] Filed: Oct. 2, 1997

[51] Int. Cl.$^6$ .................................................. H03M 1/00
[52] U.S. Cl. .......................................... 341/135; 341/155
[58] Field of Search .................................... 341/135, 150, 341/164, 165, 155

[56] References Cited

U.S. PATENT DOCUMENTS

| | | | |
|---|---|---|---|
| 4,694,201 | 9/1987 | Jason | 307/475 |
| 4,698,526 | 10/1987 | Allan | 307/475 |
| 4,761,636 | 8/1988 | Brokaw et al. | 340/347 |
| 4,810,909 | 3/1989 | Asazawa | 307/491 |
| 4,868,422 | 9/1989 | Daniele et al. | 307/451 |
| 4,963,769 | 10/1990 | Hiltpold et al. | 307/465 |
| 5,057,713 | 10/1991 | Iwamura et al. | 307/446 |
| 5,081,454 | 1/1992 | Campbell et al. | 341/141 |
| 5,166,685 | 11/1992 | Campbell et al. | 341/141 |
| 5,168,276 | 12/1992 | Huston et al. | 341/141 |
| 5,182,810 | 1/1993 | Bartling et al. | 395/750 |
| 5,262,779 | 11/1993 | Sauer | 341/161 |
| 5,272,481 | 12/1993 | Sauer | 341/165 |
| 5,281,866 | 1/1994 | Rundel | 307/296.3 |
| 5,293,167 | 3/1994 | Campbell et al. | 341/141 |
| 5,294,928 | 3/1994 | Cooper et al. | 341/142 |
| 5,302,952 | 4/1994 | Campbell et al. | 341/155 |
| 5,343,086 | 8/1994 | Fung et al. | 307/296.1 |
| 5,343,196 | 8/1994 | Harston | 341/136 |
| 5,381,034 | 1/1995 | Thrower et al. | 257/529 |
| 5,422,807 | 6/1995 | Mitra et al. | 364/184 |
| 5,469,099 | 11/1995 | Konishi | 327/198 |
| 5,489,902 | 2/1996 | Shyu et al. | 341/136 |
| 5,619,204 | 4/1997 | Byrne et al. | 341/155 |
| 5,621,409 | 4/1997 | Cotter et al. | 341/156 |
| 5,668,553 | 9/1997 | Ashe | 341/154 |

Primary Examiner—Marc S. Hoff
Attorney, Agent, or Firm—Cahill, Sutton & Thomas P.L.C.

[57] ABSTRACT

Power control circuitry is provided in an analog-to-digital converter (1) having a CDAC array (2) coupled to an analog input signal, a comparator (3), and a successive approximation register circuit (5). The power control circuitry includes a bias control circuit (4) responsive to a powerdown signal and associated wakeup signal to produce a bias control signal ($V_{BIAS}$). The bias control circuit includes a controllable current mirror circuit (10) which produces a first voltage ($V_C$) on a first conductor (13) when the powerdown signal is at a first level to allow operation of the comparator in conjunction with the CDAC array and the successive approximation register circuit. The bias control circuit also includes a wakeup circuit (20) which precharges the first conductor (13) to a predetermined bias voltage ($V_C'$) that is close in value to the first voltage ($V_C$) in response to occurrence of the first level of the powerdown signal. The bias control signal $V_{BIAS}$ is produced and equal to the first voltage $V_C$.

22 Claims, 6 Drawing Sheets

FAST WAKEUP BIASING CIRCUIT FOR ANALOG-TO-DIGITAL CONVERTER

BACKGROUND OF THE INVENTION

The invention relates to fast recovery, i.e., fast "wakeup", biasing circuits for use in digital circuitry, and more particularly to analog-to-digital converters including such fast wakeup biasing circuitry, and also to methods for operating such analog-to-digital converters.

Some state-of-the-art successive-approximation analog-to-digital converters are provided with a "power down" operating mode, wherein a "power down" control signal is generated to turn off internal bias circuits after completion of an analog-to-digital conversion cycle (which, for a 12 bit analog-to-digital converter, requires approximately 15 or 16 clock cycles). This greatly reduces the power dissipation of the analog-to-digital converter during any time interval in which no analog-to-digital conversions are occurring.

Then, when an analog-to-digital conversion is desired, the "power down" control signal is removed. This turns the bias circuits back on, i,e., "wakes them up", so the desired analog-to-digital conversion cycle can begin.

A problem of the prior art is that the "wakeup" time required for the known bias circuits is very long. Since the long wakeup time must be included in the "effective" analog-to-digital conversion time, it greatly increases the effective analog-to-digital conversion time, and greatly reduces the maximum rate at which repetitive analog-to-digital conversion cycles can be performed. Since power is being dissipated during the long wakeup, the long effective conversion time also increases the total power dissipation of the analog-to-digital conversion system, because the percentage of time that the power down mode is in effect is decreased for a particular conversion frequency.

Figure 1:
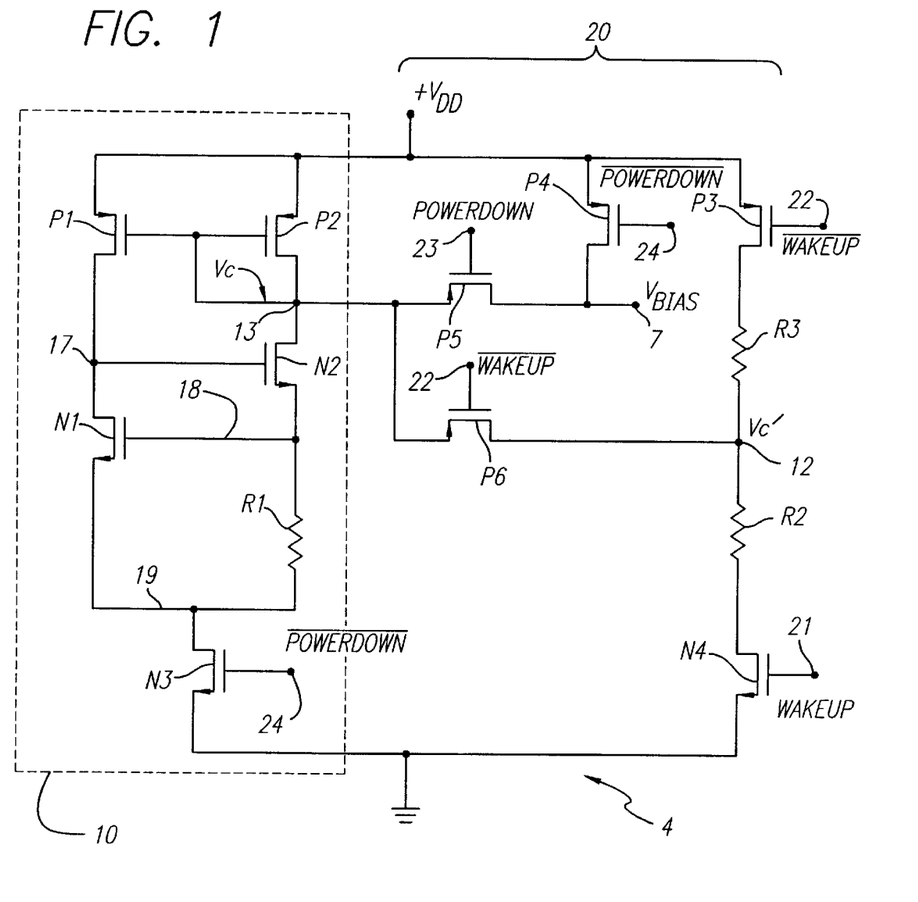
FIG. 1 is a schematic drawing of a wakeup bias circuit of the present invention.

In FIG. 1, the portion indicated by numeral 10 is a conventional prior art bias control circuit, which includes P-channel MOSFETs P1 and P2, N-channel MOSFETs N1, N2 and N3, and resistor R1 connected as shown. During the analog-to-digital conversion mode, transistors P1, P2, N1, N2, and N3 all are on, and the bias control circuit 10 functions as a current mirror control circuit, producing a voltage $V_C$ on conductor 13 which is applied to the gate electrodes of P-channel current mirror output MOSFETs in the bias circuitry of the analog-to-digital converter.

During a power down cycle, N-channel MOSFET N3 is turned off, so no current flows through any of the components of bias control circuit 10. When the power down cycle is ended, all of the MOSFETs in bias control circuit 10 are turned on. The recovery of the voltage on conductor 13 to the desired bias voltage $V_C$ is very slow (typically 5 microseconds) resulting in the slow, long "wakeup" of the bias control circuit-mentioned above. Also, it is difficult to ensure that MOSFETs N1, N2, P1, and P2 actually will turn on. Therefore, in the prior art it is necessary to provide additional circuitry to ensure that an initial current flows through MOSFETs P1, P2, N1, N2 and resistor R1 when MOSFET N3 is turned on to end the power down condition.

Known analog-to-digital converters having a power down feature are sometimes used in conjunction with a microcontroller or microprocessor to provide a data acquisition system in which low level analog signals are converted to digital signals under the control of the microcontroller; the resulting digital numbers are input to the microcontroller for further processing. The microcontroller is interrupted during each analog-to-digital conversion cycle. A typical microcontroller may operate with a clock signal having a frequency of several megahertz. The very slow wakeup or recovery time of the prior analog-to-digital converters necessitates "stretching" of a pulse of the fast microcontroller clock signal by as much as several microseconds or more to allow the recovery or "wakeup" of the bias circuit to occur before a new analog-to-digital conversion can occur. This results in long, inefficient interrupt/wait intervals during which the microcontroller is inactive.

There is a need for increasing the speed of digital circuits, especially analog-to-digital converters and the like which are sometimes operated in a powerdown mode. There also is a need to greatly reduce the overall power dissipation of such circuits, especially for battery powered applications.

SUMMARY OF THE INVENTION

Accordingly, it is an object of the invention to provide fast "wakeup" of a bias control circuit having a powerdown feature.

It is another object of the invention to provide an analog-to-digital converter having a powerdown mode of operation and a fast wakeup circuit which does not substantially increase the effective analog-to-digital conversion time.

It is another object of the invention to provide an analog-to-digital converter and method of operation which allows substantially lower overall power dissipation than has previously been achieved at any particular conversion frequency.

It is another object of the invention to provide an analog-to-digital converter which can be utilized in conjunction with a microcontroller without requiring undesirably long interrupt/wait intervals in the microcontroller.

Briefly described, and in accordance with one embodiment thereof, the invention provides power control circuitry in an integrated circuit having a powerdown mode, the integrated circuit including both analog and digital sections, wherein the integrated circuit is set to its powerdown mode by applying a powerdown signal thereto, a voltage on a conductor (13) of a bias control circuit (10) changing during the powerdown mode from a critical voltage ($V_C$) established during a powered up mode to a different voltage; a control signal (CONVERT/CS) is applied to the integrated circuit to end the powerdown mode, a wakeup signal pulse (25) is produced after the powerdown mode has ended, and a capacitance of the conductor (13) is charged to a predetermined precharge voltage ($V_C'$) during the wakeup signal pulse (25). The capacitance of the conductor (13) is charged from the precharge voltage ($V_C'$) to the critical voltage ($V_C$) after the wakeup signal pulse (25) has ended, and a bias control voltage ($V_{BIAS}$) is produced from the critical voltage ($V_C$) thus produced on the conductor (13). The bias control voltage ($V_{BIAS}$) is applied to one of the sections to allow normal operation of the integrated circuit.

In the described embodiment, the power control circuitry includes the bias voltage circuit (10), the bias voltage circuit (10) being turned off in response to the powerdown signal during the powerdown mode, and a wakeup circuit (20) coupled to the bias voltage circuit (10) for rapidly reestablishing the critical voltage ($V_C$) on the conductor (13) in the bias voltage circuit (10) after the powerdown signal has ended. The wakeup circuit (20) includes a circuit producing the wakeup signal pulse (25) after the powerdown mode has ended, a circuit producing the precharge voltage ($V_C'$), and a precharge transistor (P6) coupled between the conductor (13) and the precharge voltage circuit for precharging the conductor (13) to the precharge voltage ($V_C'$) in response to the wakeup signal pulse (25). The bias voltage circuit (10)

includes a charging transistor (P2) coupled to the conductor (13) to rapidly charge the voltage on the conductor (13) from the precharge voltage ($V_C'$) to the critical voltage ($V_C$) after the end of the wakeup pulse (25).

In the described embodiment, an analog-to-digital converter (1) for converting an analog input signal to a digital output signal includes a CDAC array (2) receiving the analog input signal and a plurality of switching control signals (6) from a successive approximation register circuit (5) receiving decision signals (9) from a comparator (3) having an input coupled to an output of the CDAC array, a bias circuit (34) in the comparator (3) receiving the bias control signal ($V_{BIAS}$) having a first level and a second level, the first level causing the bias circuit (34) to be in an operative bias condition, and the second level substantially reducing power dissipation in the comparator. The wakeup signal includes the wakeup pulse (25) having a duration of approximately one half of a clock cycle of the analog-to-digital converter. The controllable current mirror circuit (10) includes first (P1) and second (P2) MOSFETs coupled as a current mirror, sources of the first and second MOSFETs being coupled to a first supply voltage conductor (VDD), the drain of the second MOSFET (P2) being coupled to its gate, a gate of the first MOSFET (P1), the first conductor (13), and a control MOSFET (N3) which couples and decouples the controllable current mirror circuit (10) to or from a second supply voltage conductor (GND) in response to the power-down signal. The wakeup circuit (20) includes a voltage divider circuit coupled between the first (VDD) and second (GND) supply voltage conductors to produce the second predetermined bias voltage $V_C'$) and a precharge MOSFET P6 coupling and decoupling the second predetermined bias voltage of the voltage divider circuit to and from the second conductor (13) in response to the wakeup pulse (25).

DETAILED DESCRIPTION OF THE PREFERRED EMBODIMENT

By way of definition, the term "precharge" as used herein refers to rapid charging of the capacitance associated with a conductor to be precharged through a relatively low impedance charging transistor from a relatively low impedance voltage source circuit during a relatively short precharge pulse that is applied to a control terminal of the precharging transistor. Also by way of definition, the term "reference voltage" as used herein is considered to encompass the term "bias voltage".

In one embodiment of the invention, the wakeup bias circuitry 20 shown in FIG. 1 is combined with the above described prior art bias control circuit 10. The wakeup bias circuitry 20 includes P-channel MOSFETs P3, P4, P5 and P6, a resistive voltage divider including resistors R2 and R3, and an N-channel MOSFET N4. Each of P-channel MOSFETs P1 and P2 has its source electrode connected to $+V_{DD}$ and its gate electrode connected to conductor 13. The drain electrode of MOSFET P1 is connected to the drain of N-channel MOSFET N1 and the gate of N-channel MOSFET N2. The source of MOSFET N1 is connected to the drain electrode of N-channel MOSFET N3 and to the lower terminal of resistor R1. The drain electrode of MOSFET P2 is connected by conductor 13 to the drain electrode of MOSFET N2. The source electrode of MOSFET N2 is connected to the upper terminal of resistor R1. The lower terminal of resistor R1 is connected to the drain of N-channel MOSFET N3. The source of MOSFET N3 is connected to ground. Its gate electrode is connected to conductor 24 to receive a signal $\overline{POWERDOWN}$, which is the logical complement of a signal POWERDOWN on conductor 23 that is high when the bias control circuit 4 and the bias circuitry controlled by it are in a powerdown mode.

A voltage $V_C$ is produced on conductor 13 by prior art bias circuit 10 when all of its MOSFETs are turned on.

Wakeup circuitry 20 of FIG. 1 includes N-channel MOSFET N4 having its source connected to ground and its gate connected to conductor 21 to receive the signal WAKEUP, which occurs immediately after the end of a powerdown interval. The drain of MOSFET N4 is connected to the lower terminal of resistor R2, the upper terminal of which is connected by conductor 12 to the drain electrode of a P-channel MOSFET P6 in the lower terminal of a resistor R3. The gate electrode of MOSFET P6 is connected to conductor 22 to receive the signal $\overline{WAKEUP}$, which is the logical complement of WAKEUP. The source of MOSFET P6 is connected by conductor 13 to the source of a P-channel MOSFET P5. The gate electrode of MOSFET P5 is connected to conductor 23 to receive the signal POWERDOWN. The drain of MOSFET P6 is connected by conductor 7 to the drain of a P-channel MOSFET P4. The gate of MOSFET P4 is connected to conductor 24 to receive the signal $\overline{POWERDOWN}$. The source of MOSFET P4 is connected to $+V_{DD}$. Wakeup circuitry 20 produces a signal $V_{BIAS}$ on conductor 7. The upper terminal of resistor R3 is connected to the drain of a P-channel MOSFET P3. The gate of MOSFET P3 is connected to conductor 22 to receive the signal $\overline{WAKEUP}$. The source of MOSFET P3 is connected to $V_{DD}$.

Figure 2:
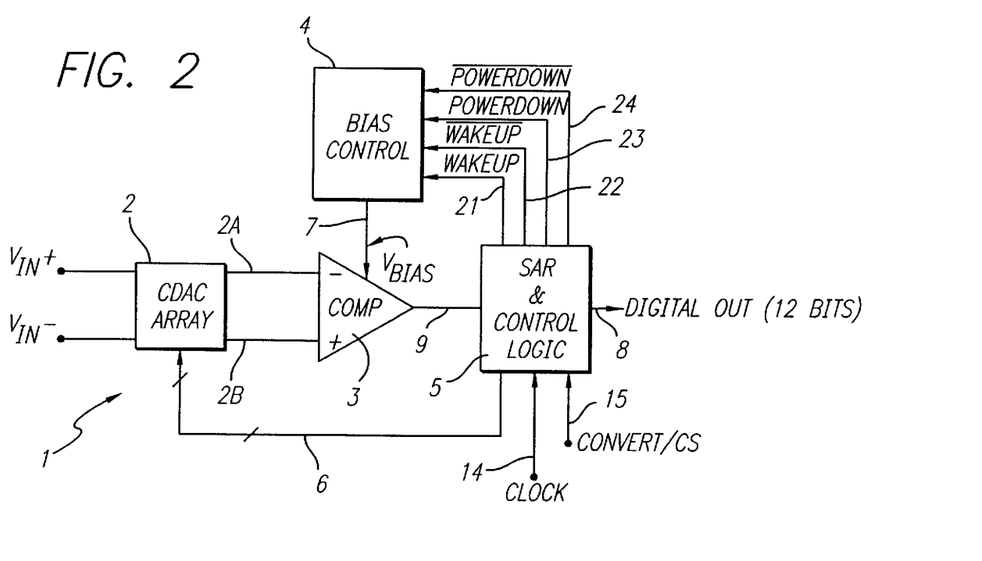
FIG. 2 is a block diagram of an analog-to-digital converter including the bias control circuit of FIG. 1.

Circuitry 20 provides a very fast wakeup operation that only requires one half of a clock cycle to produce the desired bias voltage $V_{BIAS}=V_C\approx V_C'$ on conductor 7 being applied to the comparator 3 shown in FIG. 2.

Figure 1A:
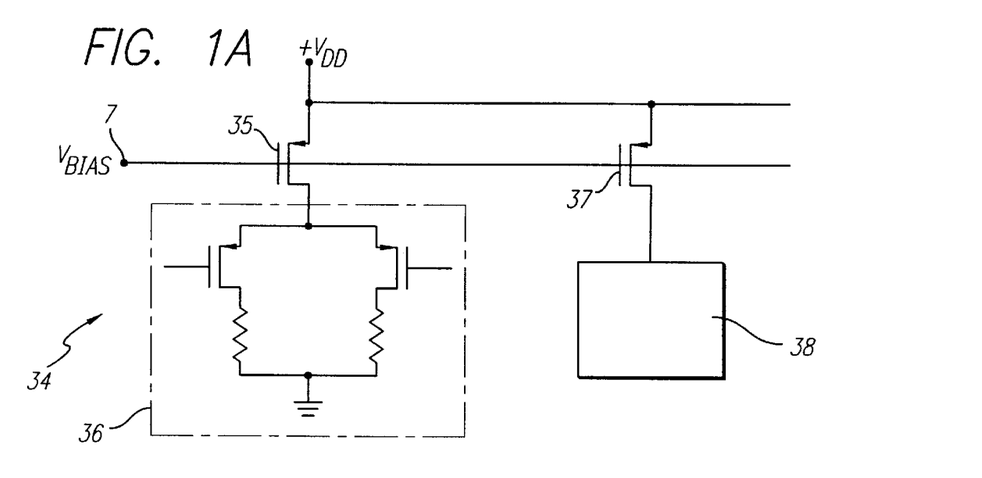
FIG. 1A is a schematic diagram of bias circuitry controlled by the wakeup bias circuit of FIG. 1.

FIG. 1A shows a typical bias circuit 34 which is controlled by bias control circuit 4 of FIG. 1. Controlled bias circuit 34 of FIG. 1A receives the voltage $V_{BIAS}$ on conductor 7, which is connected to the gate electrodes of one or more P-channel MOSFETs such as 35 and 37. MOSFETs 35 and 37 function as current mirror output devices having the same gate-to-source voltage as P-channel MOSFET P2, which is the current mirror control MOSFET in bias control circuit 10. After the voltage on conductor 13 has stabilized to $V_C$, the drain electrodes of MOSFETs 35 and 36 supply constant bias currents to one or more function circuits 36 and 38, such as differential amplifier stages.

FIG. 2 shows a simplified block diagram of an entire analog-to-digital converter including the bias control circuit 4 of FIG. 1. A differential input voltage equal to the difference between $V_{IN}+$ and $V_{IN}-$ is applied to the input of a conventional CDAC (capacitor digital-to-analog converter) array 2. CDAC array 2 produces a differential output signal between conductors 2A and 2B which are connected to the inverting (−) and non-inverting (+) inputs, respectively, of a comparator 3. Comparator 3 includes the bias circuitry 34 of FIG. 1A controlled by the signal $V_{BIAS}$ on conductor 7. The output of comparator 3 is connected to block 5, which includes a successive approximation register (SAR) and associated control logic that generates the WAKEUP, $\overline{\text{WAKEUP}}$, POWERDOWN, and $\overline{\text{POWERDOWN}}$ signals and also provides switching control signals on multiconductor bus 6 to control the switches in CDAC array 2. An external clock signal CLOCK is applied by conductor 14 as an input to block 5. A signal CONVERT/CS is applied by conductor 15 as an input to block 5 both to cause initiation of an analog-to-digital conversion process and to perform a "chip select" function.

Figure 3:
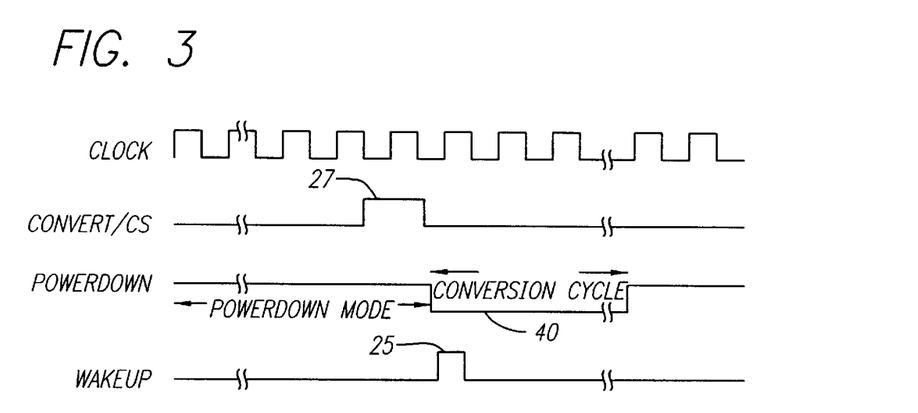
FIG. 3 is a timing diagram useful in explaining the operation of the analog-to-digital converter of FIG. 2.

Analog-to-digital converter 1 produces a digital output signal DIGITAL OUT on BUS 8. FIG. 3 shows a timing diagram of the CLOCK, CONVERT/CS, POWERDOWN, AND WAKEUP signals in FIGS. 1 and 2. (Note that analog-to-digital converter 1 is designed using CMOS technology such that comparator 3 is the only component which dissipates a substantial amount of power during an analog-to-digital conversion.)

Referring to FIGS. 1–3, the signal CLOCK is continuously applied to SAR and control logic circuit 5. A CONVERT/CS pulse 27 initiates an analog-to-digital conversion cycle. The CONVERT/CS pulse 27 in FIG. 3 accomplishes this by causing SAR and control logic 5 to generate a low level 40 of the signal POWERDOWN and essentially simultaneously to generate a pulse 25 of the signal WAKEUP, with a duration equal to that of one the CLOCK pulses. The signal POWERDOWN remains at low level 40 until both the wakeup process and the analog-to-digital conversion process are complete, and then returns to its high level.

Figure 4:
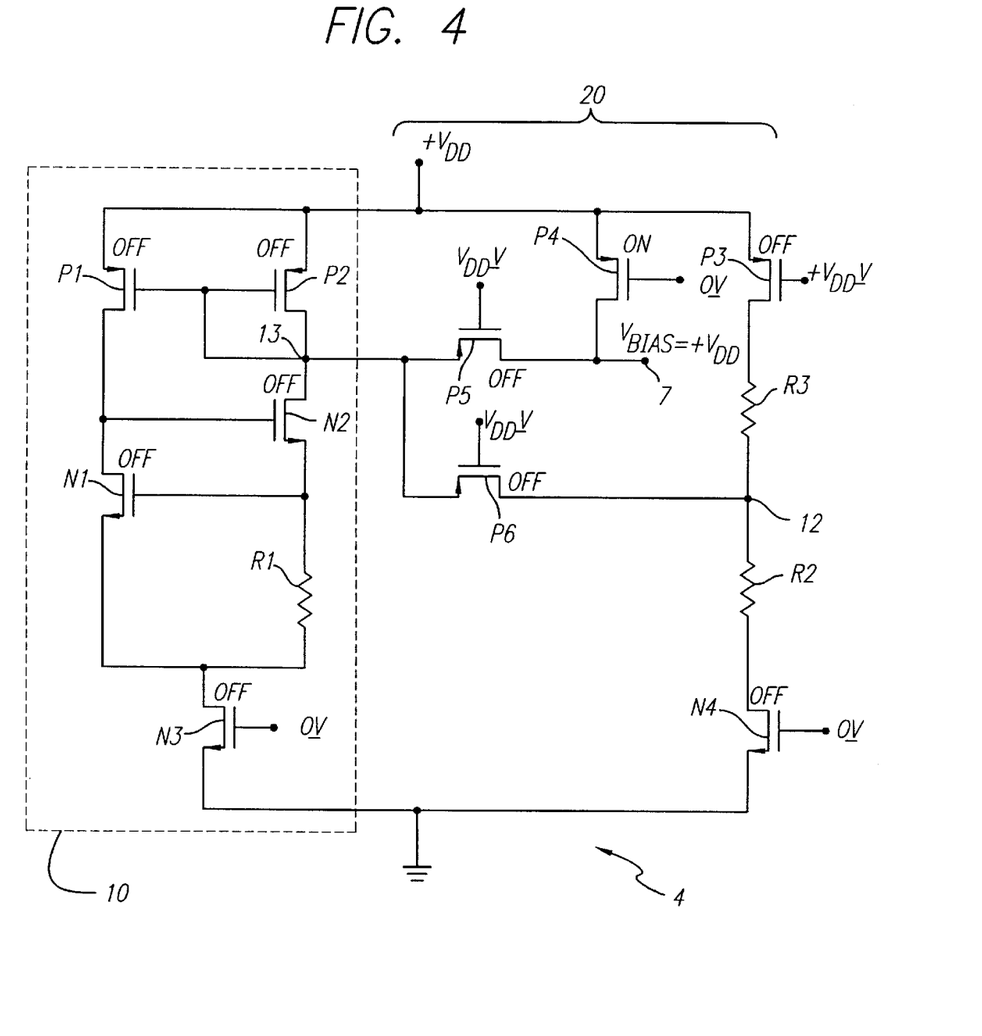
FIG. 4 is a schematic diagram illustrating the configuration of the bias circuit of FIG. 1 during a POWERDOWN mode of operation.

FIG. 4 shows the voltage levels of the POWERDOWN, $\overline{\text{POWERDOWN}}$, WAKEUP, and $\overline{\text{WAKEUP}}$ signals generated by the control logic in block 5 of FIG. 2 for a "powerdown mode" (which occurs after a previous analog-to-digital conversion signal has been completed). As indicated by the words "OFF" and "ON" adjacent each MOSFET in FIG. 4, all of them are turned off except P-channel MOSFET P4. Consequently, no current flows through bias control circuit 10, and MOSFET P4 pulls the bias voltage $V_{BIAS}$ on conductor 7 to $+V_{DD}$ volts during the POWERDOWN mode. This turns off the bias circuitry 34 (FIG. 1A) in comparator 3 of FIG. 2 by turning off P-channel MOSFETs 35 and 37, which function as bias current sources for gain stage circuitry in comparator 3. The current and hence the power dissipation of the entire analog-to-digital converter circuit 1 therefore is reduced to a very low level during the powerdown mode.

Figure 5:
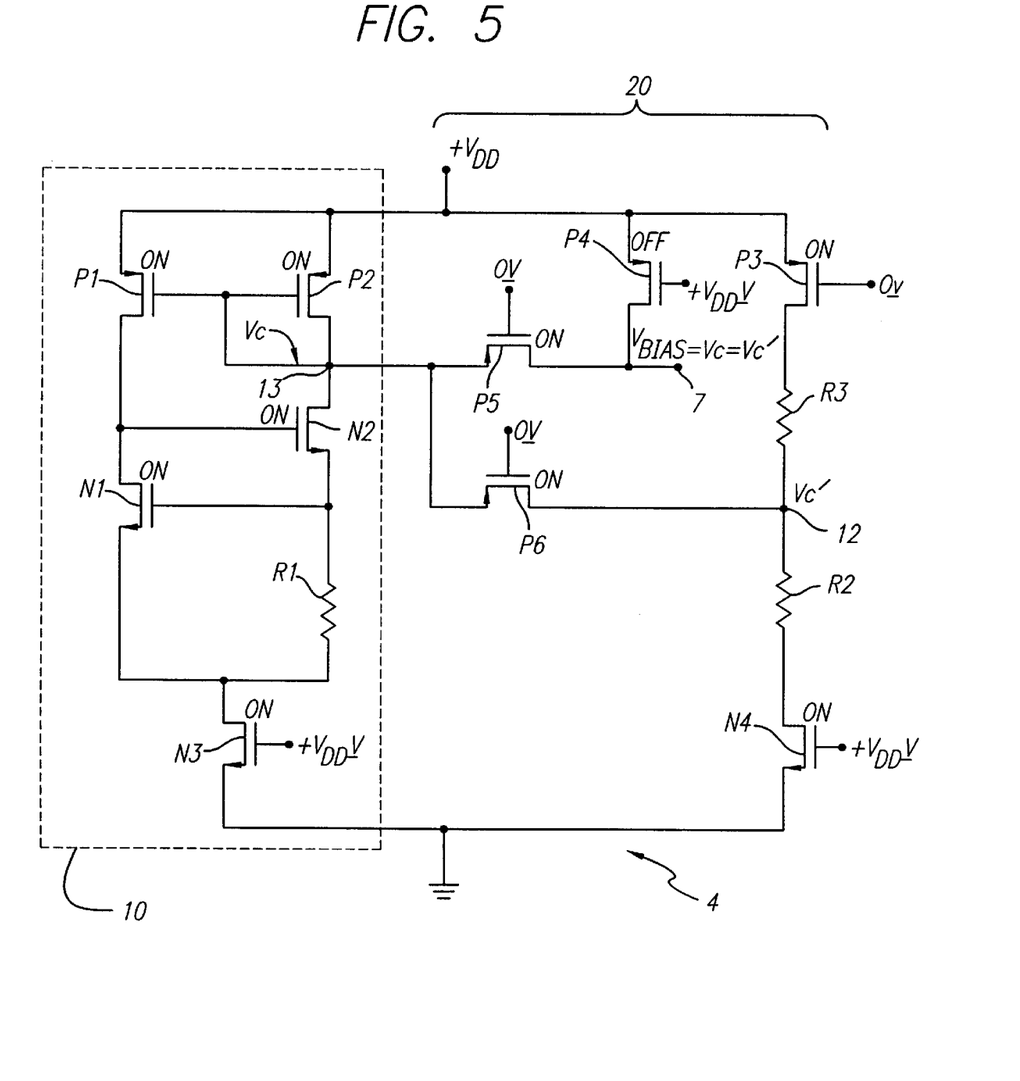
FIG. 5 is a schematic diagram illustrating the operation of the bias circuit of FIG. 1 during a WAKEUP mode of operation.

Referring to FIG. 5, the signal CONVERT/CS goes high when a new analog-to-digital conversion is required, providing the CONVERT/CS pulse 27 in FIG. 3. This produces the levels of POWERDOWN, $\overline{\text{POWERDOWN}}$, WAKEUP, and $\overline{\text{WAKEUP}}$ indicated in FIG. 5, turning on all of the MOSFETs shown in FIG. 4 except P-channel MOSFET P4. The voltage divider consisting of resistors R2 and R3 almost instantly (i.e, within 10–20 nanoseconds) produces a desired bias voltage $V_C'$ on conductor 12. Since P-channel MOSFET P6 is on, that voltage $V_C'$ almost instantly (i.e., within 10–20 nanoseconds) precharges $V_C$ on conductor 13, to the bias voltage value of $V_C'$. $V_C'$ is within a few hundred millivolts of $V_C$, depending on how precisely resistors R2 and R3 are ratioed. Since P-channel MOSFET P5 is on, the desired value of $V_{BIAS}$ on conductor 7 also is almost instantly set to $V_C$ and therefore almost instantly produces the desired internal bias currents required for operation of comparator 3. This occurs within 20 nanoseconds from the beginning of WAKEUP pulse 25, which is far faster than the several microseconds required for recovery of bias control circuits in known analog-to-digital converters having a power down mode of operation.

Figure 6:
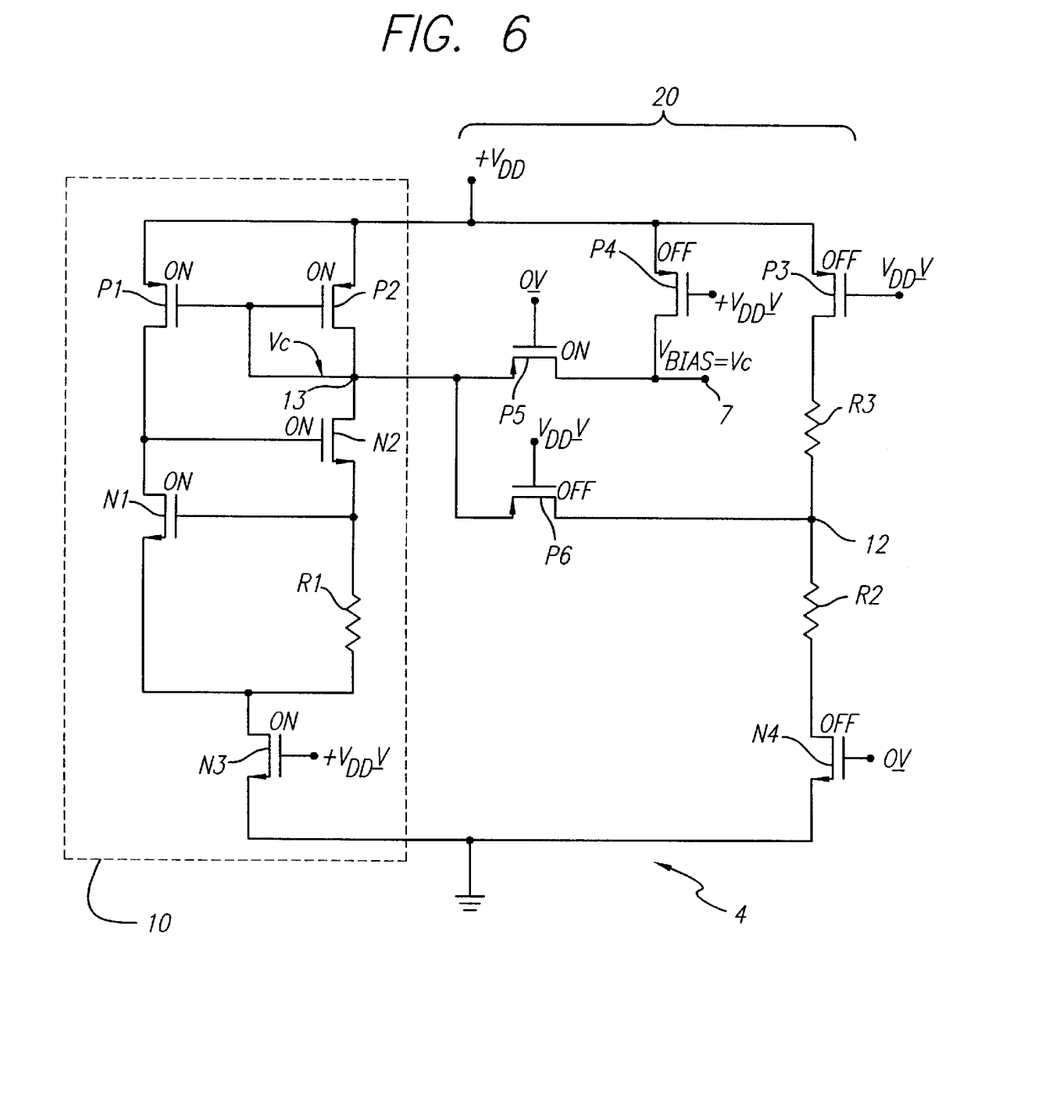
FIG. 6 is a timing diagram useful in explaining the operation of the analog-to-digital converter of FIG. 2 and comparing it with the closest prior art analog-to-digital converter with a power-down mode of operation.

Referring to FIG. 6, MOSFETs P3, P6, and N4 are turned off immediately after the end of wakeup pulse 25 (FIG. 3), and MOSFETs P1, P2, N1, N2, N3, and P5 all remain on because the POWERDOWN signal remains at zero volts. Since the capacitance of conductor 13 has been precharged to $V_C \approx V_C'$ volts (i.e., to within about 200 or fewer millivolts of $V_C$), MOSFET P2 merely needs to charge conductor 13 the rest of the way up to $V_C$ as soon as WAKEUP pulse 25 turns MOSFET P6 off and thereafter maintain $V_{BIAS}$ precisely equal to $V_C$. MOSFET P6 charges conductor 13 to $V_C'$ volts within approximately 5 nanoseconds from the leading edge of WAKEUP pulse 25, and MOSFET P2 charges conductor 13 from $V_C'$ volts to $V_C$ volts within approximately 5 nanoseconds from the trailing edge of WAKEUP pulse 25. This condition continues until the POWERDOWN signal goes high to again produce the powerdown circuit condition shown in FIG. 4.

Note that by rapidly precharging $V_C$ to $V_C'$ volts, wakeup circuit 20 ensures that all of MOSFETs P1, P2, N1 and N2 turn on when MOSFET N3 turns on (assuming that $V_C'$ on conductor 13 does not turn P1 and P2 off). This avoids the need for additional circuitry to ensure that these MOSFETs all turn on when MOSFET N3 turns on, thereby avoiding the previously mentioned problem of such MOSFETs failing to turn on when MOSFET N3 turns on.

Figure 7A:
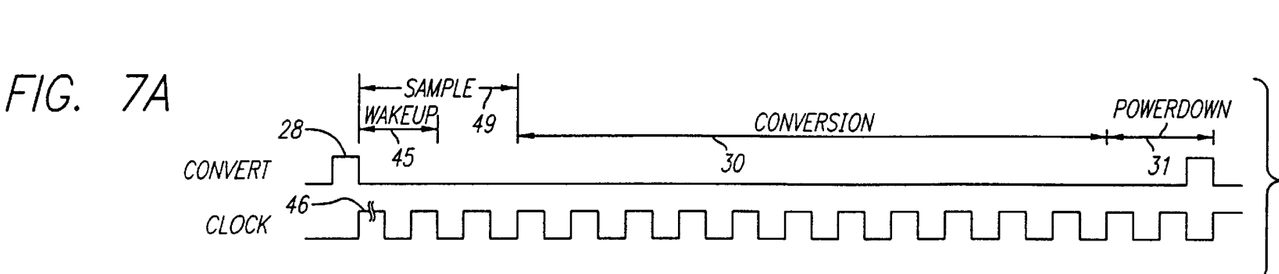
FIG. 7A is a timing diagram that is useful in explaining the operation of a typical prior art analog-to-digital converter having a powerdown feature.

In FIG. 7A, the CONVERT and CLOCK waveforms are shown for a typical prior art analog-to-digital converter having a powerdown mode. The CONVERT pulse 28 initiates the conversion or "sample" process and the slow wakeup process, as indicated by numerals 44 and 45, respectively. A CLOCK pulse 46 must be "stretched" about 5 microseconds to as long as 200 microseconds (using undesirably complex and costly circuitry) to allow the above described slow wakeup of prior art analog-to-digital converters to occur prior to the sampling of the analog input voltage.

After the wakeup operation has been accomplished during the stretched CLOCK pulse 46 and the stretched CLOCK pulse 43, the analog input signal is sampled during a one and one half clock cycle interval 29. Then the conversion cycle, which requires 12 clock cycles, occurs during the conversion interval 30. For purposes of illustration, in the timing diagram of FIG. 7 it is assumed that the frequency of CLOCK is 120 kilohertz. It also is assumed that the analog-to-digital conversion frequency is 7.5 kilohertz. This allows only a few CLOCK cycles in the interval indicated by numeral 31 which are available for powerdown mode operation of the prior art analog-to-digital converter. Consequently, only a small reduction in average power dissipation is achieved by use of the powerdown mode of the closest prior art in this example.

Figure 7B:
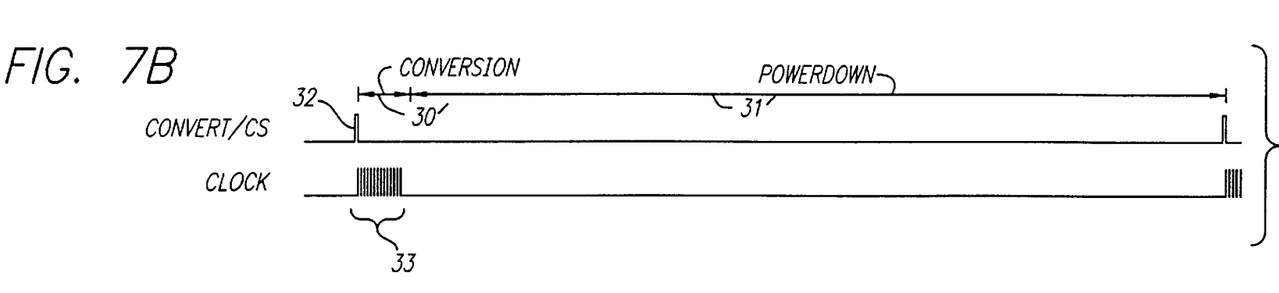
FIG. 7B is a timing diagram that is useful in explaining the operation of the analog-to-digital converter of FIG. 2.

In FIG. 7B, the waveforms CONVERT/CS and CLOCK are applied to the present assignee's above mentioned ADS7822 designed according to the present invention. For the purpose of comparison of the present invention to the prior art, it may be assumed that analog-to-digital converter 1 also is operated at a 7.5 kilohertz analog-to-digital conversion frequency. The fast wakeup circuit described herein allows long powerdown cycles. This permits use of very fast, high power amplifier circuitry to be utilized within comparator 3, although only for short intervals. This allows a much faster clock signal CLOCK operating at 1 to 2 megahertz to be used. The fast wakeup and analog-to-digital conversion processes are started by the CONVERT/CS pulse 32, at which a 1 to 2 megahertz CLOCK frequency, is a very narrow pulse. The above mentioned 10–20 nanosecond fast wakeup time occurs at the falling edge of CONVERT/CS pulse 32, and does not add an appreciable amount to the effective analog-to-digital conversion time. The fast wakeup occurs during only one half of a cycle of CLOCK and allows a much larger portion 31' of the same 7.5 kilohertz analog-to-digital conversion interval to be utilized for the powerdown mode than is possible for the closest prior art analog-to-digital converter. Thus, a much lower average current (or power dissipation level) can be achieved for the present invention with its fast wakeup circuit than for the closest prior art, by using a very fast CLOCK frequency of 1–2 megahertz and performing analog-to-digital conversions at a much slower rate. Stated differently, for the same analog-to-digital conversion frequency, the present invention can be operated at an average power dissipation level ten or more times less than the closest prior art, depending on the analog-to-digital conversion frequency.

Figure 8:
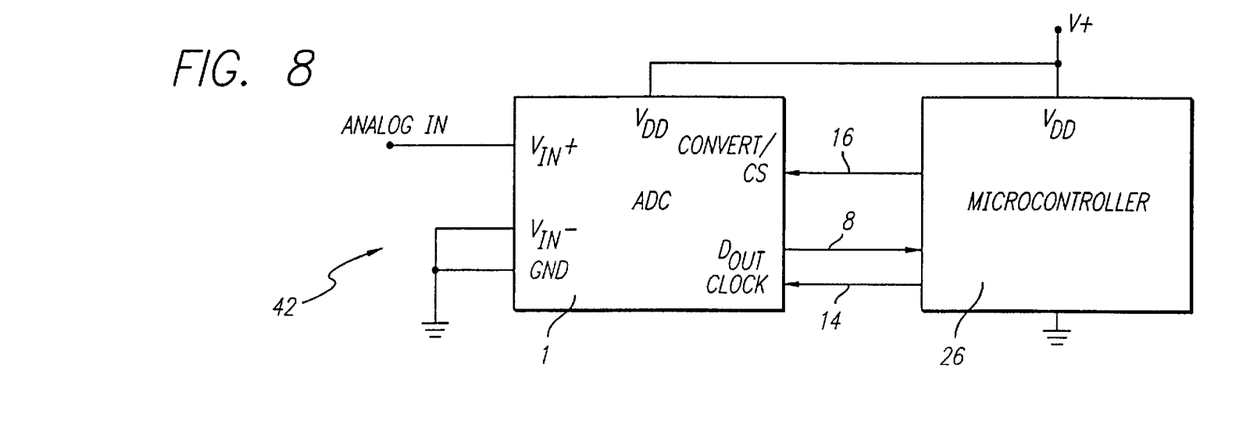
FIG. 8 is a block diagram of a microprocessor-controlled data acquisition system using the analog-to-digital converter of FIG. 2.

FIG. 8 shows a data acquisition system 42 which includes the analog-to-digital converter 1 described above, connected to a conventional microcontroller or microprocessor system 26. The analog input signal ANALOG IN to be "acquired" is connected to the $V_{IN}$+ input of analog-to-digital converter 1. The $V_{IN}$– and ground conductors of analog-to-digital converter 1 are connected to a ground reference voltage. Microcontroller 26 generates the signal CLOCK applied to conductor 14. The digital output signals to which ANALOG IN is converted are applied by a suitable serial or parallel data bus to appropriate data bus inputs of microcontroller 26. Microcontroller 26 generates a CONVERT/CS input signal to analog-to-digital converter 1 on conductor 15. Since microcontroller 42 must be in an interrupt/wait mode during each analog-to-digital conversion cycle, but can be executing instructions during the powerdown interval 31' (FIG. 7A), the fast wakeup circuit 20 and the long powerdown interval 31' which is achievable because of fast wakeup circuit 20 permit much shorter interrupt/wait times in microcontroller 26, allowing much more efficient utilization thereof.

To summarize, the desired analog-to-digital conversion can begin immediately after a very short wakeup period of only one half of a cycle of CLOCK. This can be hundreds of times faster than the wakeup time of prior analog-to-digital converters having a power shutdown feature. Consequently, the analog-to-digital converter 1 shown in FIG. 2 can operate at a very high analog-to-digital conversion rate. As subsequently explained with reference to FIG. 7, analog-to-digital converter 1 also can operate with extremely low power dissipation if a slow conversion rate is acceptable, as it often is in control applications. Furthermore, if analog-to-digital converter 1 is used with a microcontroller at the microcontroller clock frequency, such microcontroller can execute instructions during the long intervals in which analog-to-digital converter 1 is in its powerdown mode, instead of having to wait for both the long wakeup period and the long analog-to-digital conversion period of the prior art "slow wakeup" analog-to-digital converters.

Thus, the invention provides a fast "wakeup" circuit of a bias control circuit, especially for a successive approximation analog-to-digital converter. The above described fast wakeup circuit enabled me to design a 12 bit analog-to-digital converter, the assignee's part number ADS7822, which is capable of performing analog-to-digital conversions at a 75 kilosample frequency operating from a single power supply of 2.7 volts, and drawing a power supply current of only 180 microamperes. Alternatively, the fast wakeup circuit enabled me to design essentially the same analog-to-digital converter so that it is capable of performing analog-to-digital conversions at a 200 kilosample frequency from a single 5 volt power supply drawing an average current of 180 microamperes.

While the invention has been described with reference to several particular embodiments thereof, those skilled in the art will be able to make the various modifications to the described embodiments of the invention without departing from the true spirit and scope of the invention. It is intended that all elements and steps which are insubstantially different or perform substantially the same function in substantially the same way to achieve the same result as what is claimed are within the scope of the invention. For example, problems have been experienced with bandgap circuits utilized to generate reference voltage in integrated circuits in which a powerdown feature is provided. The same "slow wakeup" problem referred to above exists for bandgap circuits which have been "powered down". The above described technique of precharging the capacitance of a particular conductor in a bandgap circuit to avoid a long wakeup period is considered to be within the scope of the invention.

What is claimed is:

1. An analog-to-digital converter for converting an analog input signal to a digital output signal, comprising in combination:
   (a) a CDAC array receiving the analog input signal and a plurality of switching control signals from a successive approximation register circuit which receives decision signals from a comparator having an input coupled to an output of the CDAC array;
   (b) a bias circuit in the comparator responsive to a bias control signal having a first level and a second level, the first level causing the bias circuit to be in an operative bias condition, the second level substantially reducing power dissipation in the comparator; and
   (c) a bias control circuit producing the first level of the bias control signal on a first conductor in response to a powerdown signal and a wakeup signal, the powerdown signal having first and second levels, the wakeup signal having first and second levels, the bias control circuit including
      i. a controllable current mirror circuit which produces a first bias voltage on a second conductor when the powerdown signal assumes its first level to allow operation of the comparator in conjunction with the CDAC array and the successive approximation register circuit, an uncontrolled voltage level occurring on the second conductor when the powerdown signal assumes its second level, and ii. a wakeup circuit which rapidly precharges the second conductor to a second predetermined bias voltage substantially equal to the first bias voltage in response to the wakeup signal if the powerdown signal is at its first level, to thereby prevent slow recovery of voltage on the second conductor from the uncontrolled voltage level to the first bias voltage.

2. The analog-to-digital converter of claim 1 wherein the wakeup signal includes a wakeup pulse having a duration of approximately one half of a clock cycle of the analog-to-digital converter.

3. The analog-to-digital converter of claim 2 wherein the wakeup pulse overlaps an interval immediately after a transition of the powerdown signal from its second level to its first level.

4. The analog-to-digital converter of claim 1 wherein the controllable current mirror circuit includes first and second MOSFETs coupled as a current mirror, sources of the first and second MOSFETs being coupled to a first supply voltage conductor, the drain of the second MOSFET being coupled to its gate, a gate of the first MOSFET, the first conductor, and a control MOSFET which couples and decouples the controllable current mirror circuit to or from a second supply voltage conductor in response to the powerdown signal.

5. The analog-to-digital converter of claim 4 wherein the wakeup circuit includes a voltage divider circuit coupled between the first and second supply voltage conductors to produce the second predetermined bias voltage and a precharge MOSFET P6 coupling and decoupling the second predetermined bias voltage of the voltage divider circuit to and from the second conductor in response to the wakeup pulse.

6. The analog-to-digital converter of claim 5 wherein the voltage divider circuit includes a transistor coupling a terminal of the voltage divider circuit to one of the first and second supply voltage conductors.

7. The analog-to-digital converter of claim 5 wherein the wakeup circuit includes a bias turn off MOSFET connected to produce a bias turn off voltage level on the first conductor while the powerdown signal is at the second level.

8. The analog-to-digital converter of claim 5 wherein the wakeup circuit includes a bias turn on MOSFET connected to produce a bias turn on voltage level equal to the first bias voltage while the powerdown signal is at the first level.

9. The analog-to-digital converter of claim 4 wherein the controllable current mirror circuit includes a first cascode MOSFET coupled between a drain of the first MOSFET and a drain of the control MOSFET, and a second cascode MOSFET coupled between the first conductor and the drain of the control MOSFET.

10. The analog-to-digital converter of claim 9 including a resistor coupling the source of the second cascode MOSFET to the drain of the control MOSFET.

11. The analog-to-digital converter of claim 6 wherein the voltage divider circuit includes first and second resistors coupled in series between the first and second supply voltage conductors by the transistor.

12. The analog-to-digital converter of claim 4 wherein the bias circuit includes a current source MOSFET having a gate electrode coupled to the first conductor to receive the bias control signal and a source coupled to sources of the first and second MOSFETs.

13. Power control circuitry in an analog-to-digital converter including a CDAC array receiving an analog input signal and a plurality of switching control signals from a successive approximation register circuit receiving decision signals from a comparator having an input coupled to an output of the CDAC array, comprising in combination:

(a) a bias circuit in the comparator responsive to a bias control signal having a first level and a second level, the first level causing the bias circuit to be in an operative bias condition, the second level substantially reducing power dissipation in the comparator; and (b) a bias control circuit producing the first level of the bias control signal on a first conductor in response to a powerdown signal and a wakeup signal, the powerdown signal having first and second levels, the wakeup signal having first and second levels, the bias control circuit including i. a controllable current mirror circuit which produces a first bias voltage on a second conductor when the powerdown signal assumes its first level to allow operation of the comparator in conjunction with the CDAC array and the successive approximation register circuit, an uncontrolled voltage level occurring on the second conductor when the powerdown input signal is at its second level, and ii. a wakeup circuit which precharges the first conductor to a second predetermined bias voltage equal to the first bias voltage in response to the wakeup signal if the powerdown signal is at its first level.

14. Power control circuitry in an integrated circuit having a powerdown mode, the integrated circuit including both analog and digital sections, the power control circuitry comprising in combination:

(a) a reference voltage circuit producing a reference voltage applied to at least one of the sections, the reference voltage circuit being turned off in response to a powerdown signal during the powerdown mode;

(b) a wakeup circuit coupled to the reference voltage circuit for rapidly reestablishing a critical voltage on a conductor in the reference voltage circuit after the powerdown signal has ended, the reference voltage circuit producing the reference voltage from the critical voltage, the wakeup circuit including i. a circuit producing a wakeup signal pulse after the powerdown mode has ended, ii. a circuit producing a precharge voltage, iii. a precharge transistor coupled between the conductor and the precharge voltage circuit for precharging the conductor to the precharge voltage in response to the wakeup signal pulse, (c) the reference voltage circuit including a charging transistor coupled to the conductor to rapidly charge the voltage on the conductor from the precharge voltage to the critical voltage after the end of the wakeup pulse.

15. Power control circuitry in an integrated circuit having a powerdown mode, the integrated circuit including both analog and digital sections, the power control circuitry comprising in combination:

(a) a bias voltage circuit producing a bias voltage applied to at least one of the sections, the bias voltage circuit being turned off in response to a powerdown signal during the powerdown mode;

(b) a wakeup circuit coupled to the bias voltage circuit for rapidly reestablishing a critical voltage on a conductor in the bias voltage circuit after the powerdown signal has ended, the bias voltage circuit producing the bias voltage from the critical voltage, the wakeup circuit including i. a circuit producing a wakeup signal pulse after the powerdown mode has ended, ii. a circuit producing a precharge voltage, iii. a precharge transistor coupled between the conductor and the precharge voltage circuit for precharging the conductor to the precharge voltage in response to the wakeup signal pulse, (c) the bias voltage circuit including a charging transistor coupled to the conductor to rapidly charge the voltage on the conductor from the precharge voltage to the critical voltage after the end of the wakeup pulse.

16. A method of operating an integrated circuit including analog and digital sections, the integrated circuit having a powerdown mode, the method including the steps of:

(a) setting the integrated circuit to its powerdown mode by applying a powerdown signal thereto, a voltage on a conductor of a bias control circuit changing during the powerdown mode from a critical voltage established during a powered up mode to a different voltage;

(b) applying a control signal to the integrated circuit to end the powerdown mode;

(c) providing a wakeup signal pulse after the powerdown mode has ended;

(d) precharging a capacitance of the conductor to a predetermined precharge voltage during the wakeup signal pulse;

(e) charging the capacitance of the conductor 13 from the precharge voltage to the critical voltage after the wakeup signal pulse has ended;

(f) producing a bias control voltage from the critical voltage produced on the conductor in step (e); and (g) applying the bias control voltage to one of the sections, and then operating the integrated circuit.

17. The method of claim 16 including providing the predetermined precharge voltage during the wakeup signal pulse by coupling a voltage divider circuit between first and second supply voltage conductors in response to the wakeup signal pulse.

18. The method of claim 17 wherein step (d) includes applying the wakeup signal pulse to a control electrode of a first transistor to couple the predetermined precharge voltage to the conductor.

19. The method of claim 18 wherein step (e) includes charging the capacitance of the conductor through a diode-connected transistor.

20. The method of claim 19 wherein step (f) includes producing the bias control voltage on a bias control voltage conductor by coupling the critical voltage produced in step (e) from the conductor to the bias voltage control conductor by a second transistor after the end of the powerdown mode.

21. The method of claim 20 including producing a voltage level on the bias voltage control conductor during the powerdown mode, the voltage level causing unbiasing of the section.

22. The method of claim 21 including producing the voltage level by coupling the bias voltage conductor to the first supply voltage conductor during the powerdown mode.

* * * * *